(12) United States Patent
Starr (10) Patent No.: US 7,307,459 B2
(45) Date of Patent: Dec. 11, 2007

(54) PROGRAMMABLE PHASE-LOCKED LOOP CIRCUITRY FOR PROGRAMMABLE LOGIC DEVICE

(75) Inventor: Gregory Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/378,695

(22) Filed: Mar. 16, 2006

(65) Prior Publication Data

US 2006/0158233 A1 Jul. 20, 2006

Related U.S. Application Data

(63) Continuation of application No. 11/130,079, filed on May 16, 2005, now Pat. No. 7,071,743, which is a continuation of application No. 10/691,152, filed on Oct. 21, 2003, now Pat. No. 6,924,678.

(51) Int. Cl.
*H03L 7/06* (2006.01)
(52) U.S. Cl. ...................... 327/147; 327/156
(58) Field of Classification Search ............... 327/141, 327/147, 149, 156, 158–161; 331/17, 25, 331/DIG. 2; 375/373–376; 709/200, 231, 709/245; 714/700
See application file for complete search history.

(56) References Cited

U.S. PATENT DOCUMENTS 3,473,160 A    10/1969   Wahlstrom ............... 326/41
4,494,021 A    1/1985    Bell et al. ................. 307/591
4,633,488 A    12/1986   Shaw ......................... 375/120
4,719,593 A    1/1988    Threewitt et al. ......... 364/900
4,857,866 A    8/1989    Tateishi ..................... 331/1 A
4,868,522 A    9/1989    Popat et al. ................ 331/2
4,959,646 A    9/1990    Podkowa et al. ......... 340/825.83

(Continued)

FOREIGN PATENT DOCUMENTS

EP    0 266 065    5/1988

(Continued)

OTHER PUBLICATIONS

Advanced Micro Devices, Inc., "Am2971 Programmable Event Generator (PEG)," Publication No. 05280, Rev. C, Amendment /0, pp. 4-286-4-303 (Jul. 1986).

(Continued)

*Primary Examiner*—Linh My Nguyen
(74) *Attorney, Agent, or Firm*—Ropes & Gray LLP; Jeffrey H. Ingerman (57) ABSTRACT

A phase-locked loop ("PLL") for use in a programmable logic device ("PLD") is constructed with modular components, which may be digital, and which may be programmable or adjustable, in place of the conventional analog charge pump and loop filter. Connections are provided between those components and the remainder of the PLD so that if the PLL is not being used in a particular user design of the PLD, the PLL modular components may be used by other portions of the PLD. Similarly, those connections allow other portions of the PLD to be used in place of one or more of the modular components where more complex or special filtering than can be provided by the modular components is required.

20 Claims, 5 Drawing Sheets

U.S. PATENT DOCUMENTS

| | | | |
|---|---|---|---|
| 5,072,195 A | 12/1991 | Graham et al. ............... 331/2 |
| 5,075,575 A | 12/1991 | Shizukuishi et al. ........ 307/465 |
| 5,079,519 A | 1/1992 | Ashby et al. ............... 331/1 A |
| 5,121,014 A | 6/1992 | Huang ........................ 327/276 |
| 5,133,064 A | 7/1992 | Hotta et al. ................ 395/550 |
| 5,204,555 A | 4/1993 | Graham et al. ............ 307/465 |
| 5,208,557 A | 5/1993 | Kersh .......................... 331/57 |
| 5,239,213 A | 8/1993 | Norman et al. .............. 326/38 |
| 5,349,544 A | 9/1994 | Wright et al. .............. 364/600 |
| 5,394,116 A | 2/1995 | Kasturia ..................... 331/34 |
| 5,397,943 A | 3/1995 | West et al. .................. 326/39 |
| 5,418,499 A | 5/1995 | Nakao ......................... 331/57 |
| 5,420,544 A | 5/1995 | Ishibashi .................... 331/11 |
| 5,424,687 A | 6/1995 | Fukuda ....................... 331/11 |
| 5,448,191 A | 9/1995 | Meyer ....................... 327/105 |
| 5,477,182 A | 12/1995 | Huizer ...................... 327/261 |
| 5,506,878 A | 4/1996 | Chiang ........................ 377/39 |
| 5,542,083 A | 7/1996 | Hotta ........................ 709/400 |
| 5,581,214 A | 12/1996 | Iga .............................. 331/16 |
| 5,629,651 A | 5/1997 | Mizuno ....................... 331/34 |
| 5,642,082 A | 6/1997 | Jefferson ..................... 331/25 |
| 5,646,564 A | 7/1997 | Erickson et al. ........... 327/158 |
| 5,656,959 A | 8/1997 | Chang et al. .............. 327/105 |
| 5,691,669 A | 11/1997 | Tsai et al. .................... 331/17 |
| 5,699,020 A | 12/1997 | Jefferson ..................... 331/17 |
| 5,742,180 A | 4/1998 | DeHon et al. ............... 326/40 |
| 5,744,991 A | 4/1998 | Jefferson et al. ........... 327/158 |
| RE35,797 E | 5/1998 | Graham et al. .............. 326/40 |
| 5,777,360 A | 7/1998 | Rostoker et al. ........... 257/315 |
| 5,815,016 A | 9/1998 | Erickson .................... 327/158 |
| 5,818,302 A | 10/1998 | Otsuka et al. ............... 331/17 |
| 5,847,617 A | 12/1998 | Reddy et al. ................ 331/57 |
| 5,889,436 A | 3/1999 | Yeung et al. ................. 331/2 |
| 5,900,757 A | 5/1999 | Aggarwal et al. .......... 327/149 |
| 5,952,891 A | 9/1999 | Boudry ........................ 331/57 |
| 5,963,069 A | 10/1999 | Jefferson et al. ........... 327/158 |
| 5,970,110 A | 10/1999 | Li ............................... 377/48 |
| 5,974,105 A | 10/1999 | Wang et al. ................ 375/376 |
| 5,987,543 A | 11/1999 | Smith .......................... 710/70 |
| 5,999,025 A | 12/1999 | New .......................... 327/156 |
| 6,014,048 A | 1/2000 | Talaga, Jr. et al. ......... 327/156 |
| 6,043,677 A | 3/2000 | Albu et al. ................... 326/39 |
| 6,069,506 A | 5/2000 | Miller, Jr. et al. .......... 327/156 |
| 6,069,507 A | 5/2000 | Shen et al. ................. 327/156 |
| 6,104,222 A | 8/2000 | Embree ...................... 327/156 |
| 6,114,915 A | 9/2000 | Huang et al. ................ 331/25 |
| 6,141,394 A | 10/2000 | Linebarger et al. ......... 375/376 |
| 6,144,242 A | 11/2000 | Jeong et al. ................ 327/269 |
| 6,157,266 A | 12/2000 | Tsai et al. .................... 331/57 |
| 6,191,613 B1 * | 2/2001 | Schultz et al. ............... 326/39 |
| 6,249,189 B1 | 6/2001 | Wu et al. ..................... 331/18 |
| 6,252,419 B1 | 6/2001 | Sung et al. ................... 326/38 |
| 6,278,332 B1 | 8/2001 | Nelson et al. ................ 331/17 |
| 6,292,016 B1 * | 9/2001 | Jefferson et al. .............. 326/39 |
| 6,320,469 B1 | 11/2001 | Friedberg et al. .......... 331/1 A |
| 6,373,278 B1 | 4/2002 | Sung et al. ................... 326/38 |
| 6,411,150 B1 | 6/2002 | Williams .................... 327/281 |
| 6,437,713 B1 | 8/2002 | Lesea .......................... 341/78 |
| 6,448,820 B1 | 9/2002 | Wang et al. .................. 327/12 |
| 6,462,623 B1 | 10/2002 | Horan et al. .................. 331/17 |
| 6,483,886 B1 | 11/2002 | Sung et al. ................. 375/376 |
| 6,690,224 B1 | 2/2004 | Moore ........................ 327/296 |
| 6,718,477 B1 | 4/2004 | Plants et al. ................ 713/500 |
| 2001/0033188 A1 | 10/2001 | Aung et al. ................. 327/141 |

FOREIGN PATENT DOCUMENTS

| | | |
|---|---|---|
| EP | 0 416 930 | 3/1991 |
| EP | 0 778 517 | 6/1997 |
| EP | 0 987 822 | 3/2000 |
| EP | 1 056 207 | 11/2000 |
| EP | 1 223 493 | 7/2002 |
| JP | 1-137646 | 5/1989 |
| JP | 10-215156 | 8/1998 |

OTHER PUBLICATIONS

Advanced Micro Devices, Inc., "AmPAL* 23S8 20-Pin IMOX PAL-Based Sequencer," Publication No. 06207, Rev. B, Amendment /0, pp. 4-102-4-121 (Oct. 1986).

Agere Systems, Inc., "ORCA ORT82G5 0.622/1.0-1.25/2.0-2.5/3.125 Gbits/s Backplane Interface FPSC," Preliminary Data Sheet, pp. 1-35 (Jul. 2001).

Agere Systems, Inc., "ORCA 8850 Field-Programmable System Chip (FPSC) Eight Channel×850 Mbits/s Backplane Transceiver," Product Brief, pp. 1-6 (Jul. 2001).

Agere Systems, Inc., "ORCA 8850 Field-Programmable System Chip (FPSC) Eight Channel×850 Mbits/s Backplane Transceiver," Product Brief, pp. 1-36 (Aug. 2001).

DynaChip Corp., "Application Note: Using Phase Locked Loops in DL6035 Devices" (1998).

DynaChip Corp., DY6000 Family Datasheet (Dec. 1998).

Ko, U., et al., "A 30-ps Jitter, 3.6 μs Locking, 3.3-Volt Digital PLL for CMOS Gate Arrays," *Proceedings of the IEEE 1993 Custom Integrated Circuits Conference*, Publication No. 0-7803-0826-3/93, pp. 23.3.1-23.3.4 (May 9-12, 1993).

LSI Logic Corp., 500K Technology Design Manual (Document DB04-000062-00, First Edition), pp. 8-1-8-33 (Dec. 1996).

Lucent Technologies, Inc., Optimized Reconfigurable Cell Array (ORCA<) OR3Cxxx/OR3Txxx Series Field-Programmable Gate Arrays, Preliminary Product Brief, (Nov. 1997).

Lucent Technologies, Inc., ORCA< Series 3 Field-Programmable Gate Arrays, Preliminary Data Sheet, Rev. 01 (Aug. 1998).

Monolithic Memories, Inc., "Programmable Array Logic PAL20RA10-20 Advance Information," pp. 5-95-5-102 (Jan. 1988).

National Semiconductor Corp., *LVDS Owner's Manual & Design Guide* (Apr. 25, 1997).

National Semiconductor Corp., "DS90CR285/DS90CR286 +3.3V Rising Edge Data Strobe LVDS 28-Bit Channel Link-66 MHZ," (Mar. 1998).

Xilinx, Inc., Virtex 2.5V Field Programmable Gate Arrays Advance Product Specification (Version 1.0) (Oct. 20, 1998).

Xilinx, Inc., Application Note: Using the Virtex Delay-Locked Loop (Version 1.31) (Oct. 21, 1998).

Zaks, R., et al., *From Chips to Systems: An Introduction to Microcomputers*, pp. 54-61 (Prentice-Hall, Inc., Englewood Cliffs, N.J., 1987).

* cited by examiner

| SIGNAL | ADVANCE FBCLK | RETARD FBCLK |
|---|---|---|
| REFCLK | ⎍⎍ | ⎍⎍ |
| FBCLK | ⎍⎍ | ⎍⎍ |
| UP | ⎍⎍ | |
| DOWN | | ⎍⎍ |

PROGRAMMABLE PHASE-LOCKED LOOP CIRCUITRY FOR PROGRAMMABLE LOGIC DEVICE

This is a continuation of commonly-assigned U.S. patent application Ser. No. 11/130,079, filed May 16, 2005, now U.S. Pat. No. 7,071,743, which is a continuation of application Ser. No. 10/691,152, filed Oct. 21, 2003, now U.S. Pat. No. 6,924,678.

BACKGROUND OF THE INVENTION

This invention relates to phase-locked loop circuitry including programmable components, and particularly to such circuitry, for use in a programmable logic device, where the programmable components can be used for other purposes.

It is known to incorporate phase-locked loop ("PLL") circuitry on programmable logic devices ("PLDs"). For example, it has become common for PLDs to accommodate various input/output standards, some of which require very accurate high-speed clocks. One way of providing such clocks is to provide PLL circuitry on the PLD.

A basic PLL includes a phase-frequency detector ("PFD"), a charge pump, a loop filter and a voltage-controlled oscillator ("VCO"), connected in series. The input or reference frequency is one input to the PFD. The output of the VCO, which is the output of the PLL, is also fed back to another input of the PFD. If the feedback signal is not locked to the input reference signal, then the PFD output will be a signal (voltage) whose sign is indicative of whether the output leads or lags and whose magnitude is indicative of the amount of lead or lag. That signal is filtered by the charge pump and loop filter and is input to the VCO, causing the output frequency to change. Eventually, the output signal will lock to the phase of the input reference signal. In this simple example, the output signal also will lock to the frequency of the input reference signal, but in most PLLs, counters on the input and output of the PLL are used to divide the input frequency, while a counter/divider in the feedback loop is used to multiply the input frequency. Thus the frequency of the output signal can be any rational multiple of the input frequency, but will be phase-locked to the input frequency.

PLLs are thus relatively large and complex circuits, and providing PLLs on PLDs therefore either adds significant area to the PLD, or takes away area that could be used for programmable logic circuitry in a PLD of a given size. This is of particular concern because the PLLs that are provided may not be used in a particular user design, so that, as far as that user is concerned, the PLL circuitry is simply wasted. It would be desirable to be able to recapture that circuitry when it is not being used as a PLL.

Conversely, PLLs that are provided on a PLD typically are of a fixed design determined by the PLD manufacturer. However, for particular user designs, that fixed PLL design may not be suitable. Heretofore in such cases, the user had to either provide a PLL externally, or consume programmable logic resources on the PLD, which could have been put to other uses, to construct a PLL meeting the particular needs of the user design. It would be desirable to be able to provide more flexible PLL circuitry on a PLD.

SUMMARY OF THE INVENTION

The present invention provides phase-locked loop circuitry on a programmable logic device that is both more flexible than previously known PLL circuits on PLDs and able to be, at least in part, recaptured when not being used as a PLL. This is accomplished by replacing the conventional analog filter components in the control loop of the PLL with a series of components which may be adjustable or programmable, and which may have connections to other portions of the PLD.

When the PLL circuitry of the PLD is used as a PLL, the adjustability of the components, if provided, makes the PLL more flexible than previously known fixed PLL implementations. Moreover, if the components have connections to other portions of the PLD, then in some circumstances, if the user design calls for more complex filtering than is provided in the PLL circuitry, even with adjustable components, then more complex filter components can be implemented elsewhere in the PLD and substituted for portions of the PLL circuitry.

By the same token, when the PLL circuitry is not being used as a PLL, the connections of certain PLL components to other portions of the PLD make those PLL components available for incorporation into the user design for other purposes, thereby reclaiming, in some user designs, what otherwise would be wasted circuitry.

In a preferred embodiment of the invention, those components that are particular to PLLs—i.e., those components that make it preferable to provide dedicated PLL circuitry on a PLD rather than expect users to create PLLs from programmable logic—are provided in their conventional fixed analog form. These include, in particular, the phase-frequency detector and the voltage-controlled oscillator. However, one or more components of the analog filtering path—i.e., the charge pump and loop filter—may be provided in digital form, and may be adjustable or programmable. In addition to allowing the components to be reused for other purposes as described above, providing the filtering components in digital form may allow more elaborate filtering schemes to be used, and also may allow for improved noise rejection in the feedback loop. As stated above, these digital components may be provided with some adjustability, allowing them to be programmed by the user to achieve some of these advantages.

In one preferred embodiment, the analog filtering components—i.e., the charge pump and loop filter—may be replaced by an analog front end, an analog-to-digital converter ("ADC"), a digital signal processor ("DSP") and a digital-to-analog converter ("DAC"). In one version of this embodiment, the analog front end may resemble a conventional charge pump, so that effectively only the loop filter is replaced by the ADC, DSP and DAC.

In the aforementioned embodiment, there preferably are connections from a first external pin to an input of the ADC, from an output of the ADC to the programmable logic components of the PLD (i.e., to one or more of the programmable logic regions of the PLD, or alternatively to the general purpose interconnect of the PLD, allowing the ADC output to be routed to any programmable logic region), from the programmable logic components of the PLD to an input of the DAC, and from an output of the DAC to a second external pin. Several possible configurations flow from the availability of these connections.

First, if the PLL is not being used as a PLL at all, then an external signal can be routed from the first external pin to the ADC and thence to the programmable logic components, thereby providing the user with an ADC through which to route an external input signal prior to processing by digital logic. By connecting the first external pin to another external pin, an internal signal can be routed out of the PLD and back in through the ADC if an ADC is needed for intermediate conversion of an analog signal to digital format.

Similarly, a digital output signal can routed from the programmable logic components to the DAC and thence to the second external pin as an analog output signal. Again, by connecting the second external pin to another external pin, a digital signal can be routed out of the PLD through the DAC and back in through the other pin if a DAC is needed for intermediate conversion of a digital signal to analog format.

Alternatively, when the PLL is not being used, the ADC, DSP and DAC can be used as a unit. An analog signal to be processed by the DSP can be input on the first terminal and output on the second terminal. The user can use this block of circuitry independently of the remainder of the PLD, or, by connecting the first and second terminals to other terminals, can route signals out of the programmable logic core of the PLD into the ADC/DSP/DAC block and then back into the programmable logic core. Or by connecting only one of the first and second terminals to another terminal, the user can use the ADC/DSP/DAC block either as a front end for processing an input signal before inputting it to the programmable logic core of the PLD, or as a back end for processing an output signal from the programmable logic core.

In addition, as stated above, the connections from the ADC output to the PLD core and from the PLD core to the DAC input can be used when the PLL is in use to route the PLL feedback signal through an alternate DSP or other filter constructed in the PLD core according to a user design which may require more complex, or simply different, filtering than is provided by the "standard" DSP. For example, in some applications it may be desirable to convert the feedback signals from the time domain to the frequency domain and perform the filtering in the frequency domain.

Other connections can be provided in other embodiments. For example, an input to the DSP from the PLD core, and an output from the DSP to the PLD core, can be provided to allow the DSP (without the ADC or DAC) to be used by user logic in the PLD core (e.g., in cases where the user logic is already in digital mode, or where the user constructs a more elaborate, or simply different, ADC and/or DAC).

It should be noted that while the invention has been described up to this point as including a voltage-controlled oscillator (VCO), it may also include a current-controlled oscillator ("CCO") in which case the DAC should operate in current mode rather than voltage mode.

In another preferred embodiment, the analog PFD could be replaced by one or more digital components, eliminating the need for the ADC. Although there would no longer be an ADC in such an embodiment, the DSP and DAC could be reusable, separately or as a unit, in the manner described above for the embodiment that includes an ADC.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention improves resource utilization in PLDs having PLLs incorporated thereon, by allowing portions of unused PLLs to be used for other functions by the programmable logic core of the PLD, and also by allowing portions of the programmable logic core to be substituted for portions of the PLLs. This is achieved by breaking down the conventional analog filtering elements of a PLL feedback loop into blocks that may include digital circuitry and that may be programmable or adjustable, and by providing connections between individual ones of those blocks and the programmable logic core of the PLD.

The invention will now be described with reference to FIGS. 1-6.

Figure 1:
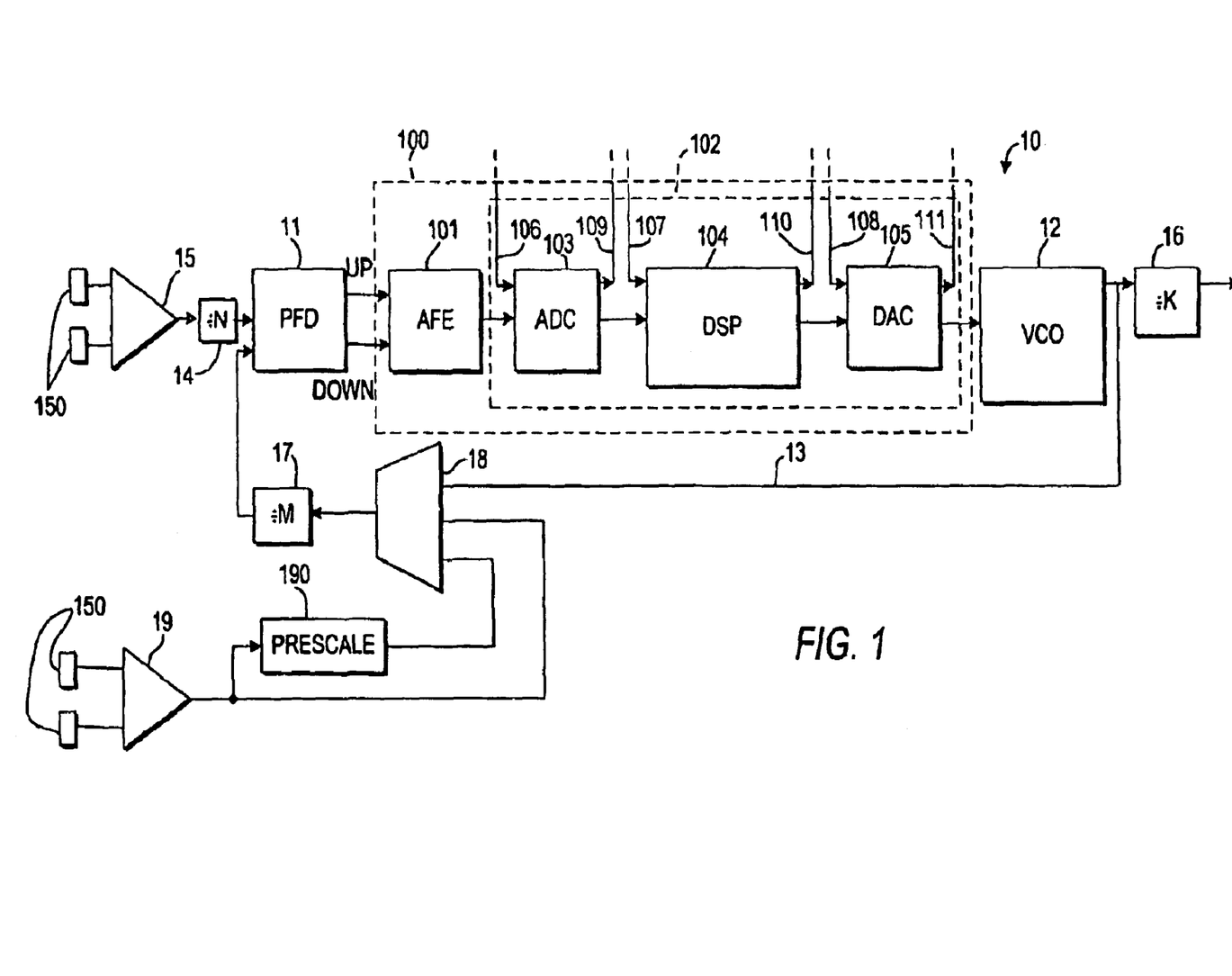
FIG. 1 is a block diagram of a preferred embodiment of a phase-locked loop circuit according to the present invention.

A phase-locked loop 10 according to the present invention preferably includes a phase-frequency detector (PFD) 11 and voltage-controlled oscillator (VCO) 12, which may (but need not) be conventional. The output of VCO 12 is fed back to PFD 11 through feedback loop 13, to which a reference signal is also input. A prescale counter 14 may be located between input buffer 15 and PFD 11 to divide the input reference frequency by a preloaded integer value N. A postscale counter 16 may be provided to divide the output frequency by a preloaded integer value K. A feedback scale counter 17 may be provided in feedback loop 13 to divide the frequency of the feedback signal by a preloaded integer value M, with the effect of multiplying the output frequency by M. Together, counters 14, 16 and 17 have the effect of multiplying the input frequency by M/(NK). Without counters 14, 16 and 17 a PLL would also be a "frequency-locked loop," because in addition to the output phase being the same as the input phase, the output frequency would be the same as the input frequency.

There may be certain specialized user designs in which it is not sufficient simply to feed back the output of VCO 12. In some cases, external filtering of the output signal might be desired prior to feeding the signal back through feedback loop 13. For such cases, multiplexer 18 and input buffer 19 are provided.

Multiplexer 18 is located in feedback loop 13 after VCO 12 and before feedback scale counter 17, thereby allowing a signal other than the output of VCO 12 to be fed back through counter 17 to PFD 11. The output of counter 16, suitably filtered in some external circuitry, which may be part of PLD 20 or external to PLD 20, could be input again through input buffer 19. In certain high-frequency applications, such as those involving RF frequencies, the frequency of the signal input at buffer 19 may be too high for PLL 10.

For that reason, prescale divider 190 is also provided, allowing multiplexer 18 to select from among the output of VCO 12, an input from input buffer 19, or an input from input buffer 19 after frequency division by prescale divider 190.

Each of input buffers 15, 19 is shown with two input terminals 150. It is contemplated that buffers 15, 19 allow for the use of differential signaling schemes (e.g., Low Voltage Differential Signaling, or "LVDS"). However, such signaling schemes form no part of the present invention, which may be used with either differential or single-ended signaling schemes.

Where a conventional PLL would have an analog charge pump and loop filter, PLL 10 preferably includes digital filter 100. Digital filter 100 preferably includes an analog front end (AFE) 101, which preferably replaces the charge pump, and a digital filter element 102, which preferably replaces the loop filter. One or both of AFE 101 and filter element 102 preferably are adjustable and/or programmable to allow a user to select different filter characteristics.

Preferably, digital filter element 102 includes, in series, an analog-to-digital converter (ADC) 103, a digital signal processor (DSP) 104 and a digital-to-analog converter (DAC) 105. Although these three devices preferably are connected in series, each also preferably has respective inputs 106, 107, 108, and respective outputs 109, 110, 111, from or to, respectively, other parts of a device, such as PLD 20 (FIG. 2), of which PLL 10 may be a part. Particularly in the case of input 106 to ADC 103 and output 111 from DAC 105, the other part of the device may be an input/output pin, or may be other circuitry on the device, while for the other inputs and outputs 107-110, the other part of the device is preferably other circuitry on the device, although it could be an input/output pin as well.

The resolution and conversion range of ADC 103 preferably are selected so that the desired phase error correction and phase detector pull-in range can be achieved. Similarly, the resolution of DAC 105 preferably is determined by knowing the gain of VCO 12, which allows the frequency variation that must be supported by the DAC resolution to be determined. For example, if the VCO gain is 2 GHz/V and the DAC bit resolution is 100 µV, then the frequency error resulting from a one-bit variation would be:

$$2 \times 10^3 \text{ MHz/V} \times 100 \times 10^{-6} \text{ V} = 200 \times 10^{-3} \text{ MHz} = 0.2 \text{ MHz}.$$

At a frequency, e.g., of 500 MHz, an error of 0.2 MHz would result in jitter of:

$$(1/(500 \text{ MHz})) - (1/(500.2 \text{ MHz})) = 8 \times 10^{-7} \text{ µs} = 0.8 \text{ ps}.$$

Figure 2:
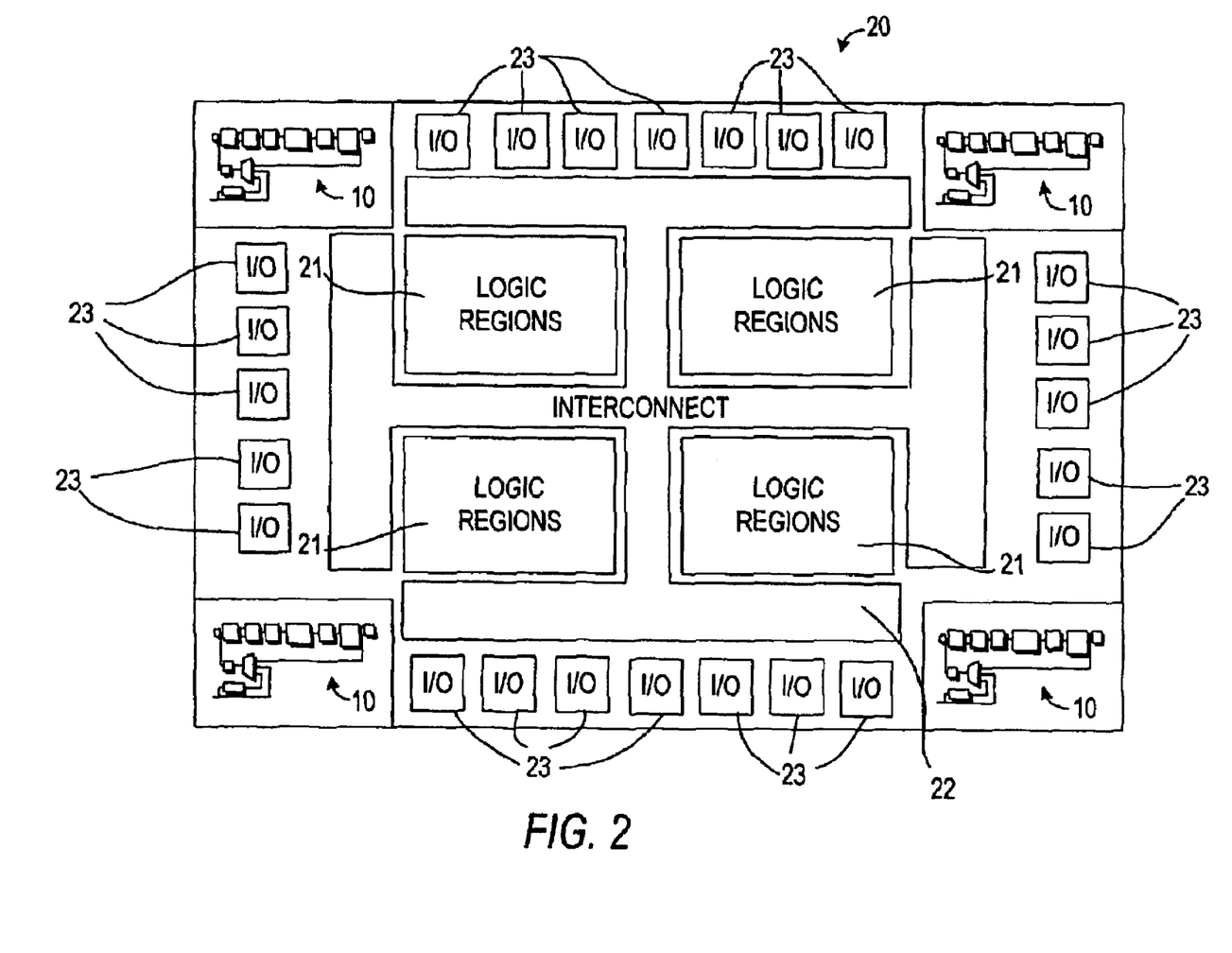
FIG. 2 is a block diagram of an exemplary programmable logic device incorporating a phase-locked loop circuit according to the present invention.

PLD 20, shown schematically in FIG. 2, is one example of a device of which PLL 10 may be a component. PLD 20 preferably includes a plurality of programmable logic regions 21 accessible to programmable interconnect structure 22. The layout of regions 21 and interconnect structure 22 as shown in FIG. 2 is intended to be schematic only, as many actual arrangements are known to, or may be created by, those of ordinary skill in the art. Similarly, the locations of PLLs 10 on PLD 20 are shown schematically only, as PLLs 10 actually may be located anywhere on PLD 20, including inside logic regions 21, in accordance with the design of a particular PLD 20.

PLD 20 also includes a plurality of input/output (I/O) regions 23. I/O regions 23 preferably are programmable, allowing the selection of one of a number of possible I/O signaling schemes, which may include differential and/or non-differential signaling schemes. Alternatively, I/O regions 23 may be fixed, each allowing only a particular signaling scheme. In some embodiments, a number of different types of fixed I/O regions 23 may be provided, so that while an individual region 23 does not allow a selection of signaling schemes, nevertheless PLD 20 as a whole does allow such a selection. In any event, whether I/O regions 23 can handle only one or a plurality of signaling schemes, among those signaling schemes could be a differential signaling scheme. Therefore, PLL 10 is designed to allow connection to circuitry external to PLL 10, including circuitry on PLD 20, that uses differential signaling schemes as discussed above.

The provision of DSP 104 as part of digital filter 100 gives digital filter 100 a degree of programmability, and therefore flexibility, not heretofore found in PLLs. Not only does the programmability of DSP 104 allow adjustment of the filtering characteristics of PLL 10 itself, but it also provides a programmable DSP capability on PLD 20. If digital signals are present on PLD 20, they can be processed, by way of input 107 and output 110, by DSP 104 of a PLL 10 that is not being used. Analog signals similarly can be processed, by way of input 106 and output 111, by DSP 104 of a PLL 10 that is not being used. By combining input 106 and output 110, analog signals can be processed by DSP 104 and allowed to remain in digital mode after processing. By combining input 107 and output 111, digital signals can be processed by DSP 104 and converted to analog mode after processing.

Similarly, when PLL 10 is not being used, ADC 103 and DAC 105 are available for standalone use via input 106 and output 109, or input 108 and output 111, respectively.

Moreover, when PLL 10 is in use, in a particular application more complex filtering than is possible with DSP 104 may be desired. In such a case, using output 109 and input 108, the feedback signals can be filtered instead by circuitry elsewhere on PLD 20, or even outside PLD 20 assuming that the signal paths can be kept sufficiently short to avoid unacceptable signal skew. Thus, a filter circuit may be constructed according to the user design in one of programmable logic regions 21. Alternatively, a more complex DSP may be built-in elsewhere on PLD 20, as disclosed, e.g., in commonly-assigned U.S. Pat. No. 6,538,470.

Figure 3:
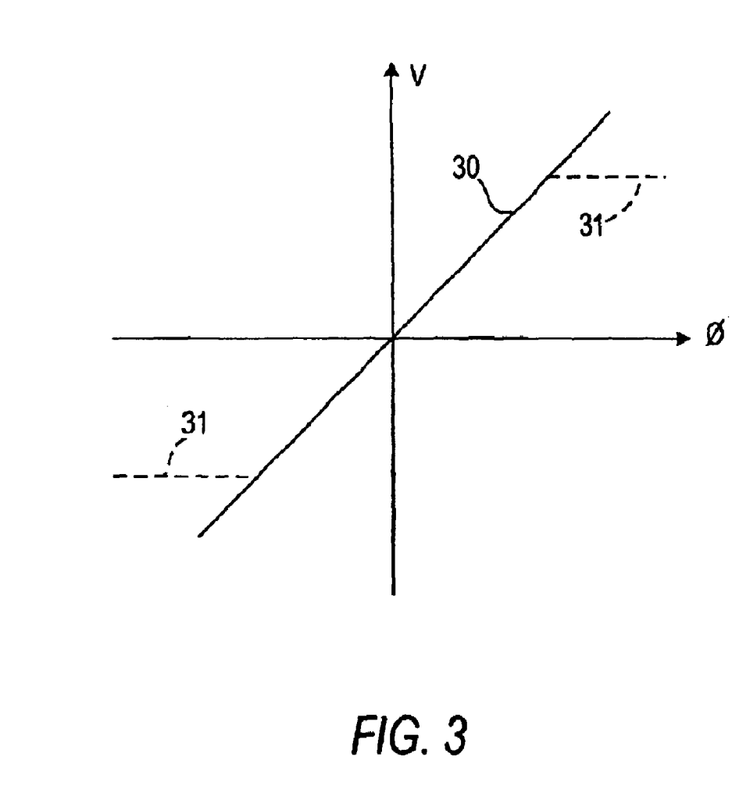
FIG. 3 is a graph showing preferred input/output characteristics of the analog front end of the phase-locked loop circuit of FIG. 1.

Preferably, AFE 101 has the output characteristic shown in FIG. 3. As shown there, the output is a voltage 30 that is a linear function of the phase error indicated by PFD 11. As a practical matter, the maximum output voltage of AFE 101 may be limited. For example, ordinarily the output voltage cannot exceed the power supply voltage, and therefore the output voltage may saturate at a certain value, as indicated in phantom at 31, no matter how much larger the phase error becomes.

Figure 4:
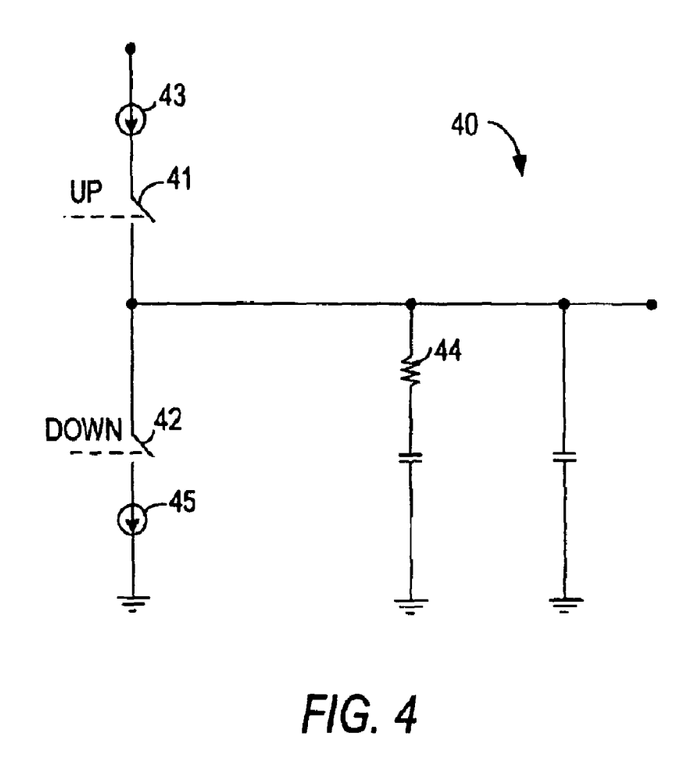
FIG. 4 is a schematic diagram of a preferred embodiment of the analog front end of the phase-locked loop circuit of FIG. 1.

One example of a suitable circuit that can be used as AFE 101 is shown in FIG. 4. AFE circuit 40 is substantially identical to a conventional charge pump as used in conventional PLLs. Thus, if PFD 11 generates an UP signal, meaning that the phase must be advanced, switch 41 will close and current will be sourced from current source 43 to create a positive voltage on resistor 44 that is passed to digital filter 102. Similarly, if PFD 11 generates a DOWN signal, meaning that the phase must be retarded, switch 42 will close and current will be sunk into current source 45 to create a negative voltage on resistor 44 that is passed to digital filter element 102.

It should be noted, however, that any analog front end having the desired phase-versus-voltage characteristic, such as the characteristic shown in FIG. 3, can be used as AFE 101.

Figure 5:
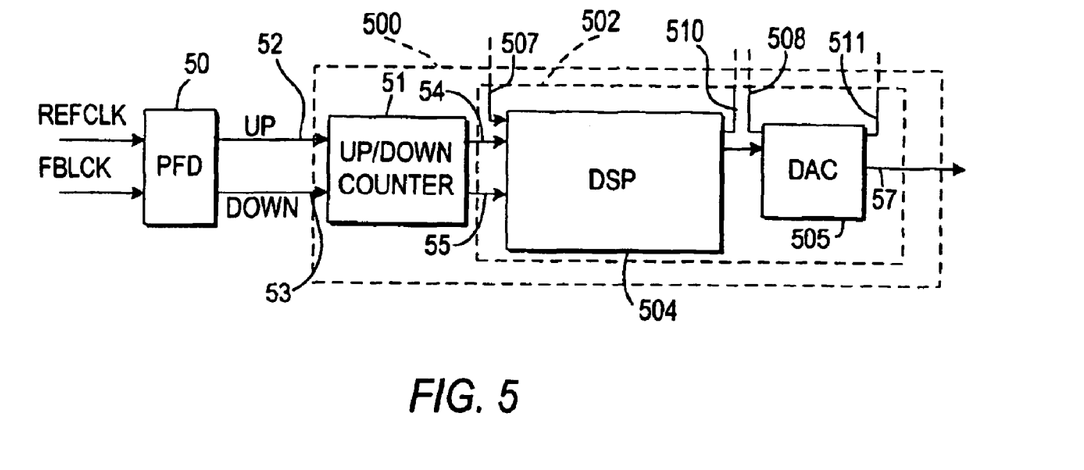
FIG. 5 is a block diagram of an alternate preferred embodiment of a portion of the phase-locked loop circuit of FIG. 1.
Figure 6:
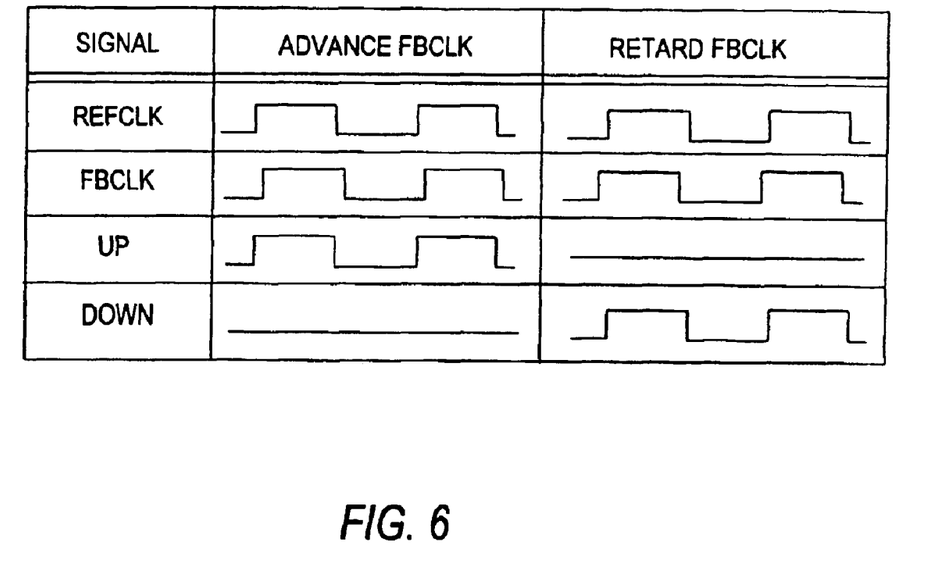
FIG. 6 is a table showing preferred characteristics of the phase-frequency detector in the embodiment of FIG. 5.

In addition, in an alternative preferred embodiment, instead of providing and analog PFD such as PFD 11, and an analog front end such as AFE 101, a digital PFD 50 and an up/down counter 51 could be provided as shown in FIG. 5.

Instead of providing analog UP and DOWN outputs as does PFD 11, whose analog outputs indicate not only whether the phase needs to be retarded or advanced but by how much, digital PFD 50 provides simple UP and DOWN signals 52, 53. The magnitude of the required phase advance or retardation is indicated not by the magnitude of signals 52, 53, but by how often signals 52, 53 occur, as counted by up/down counter 51. The output of digital PFD 50 is shown in the table in FIG. 6. As shown, if the feedback signal, FBCLK, is low on a rising edge of the reference signal, REFCLK, the UP signal goes high, signaling that FBCLK must be advanced. If the reference signal, REFCLK, is low on a rising edge of the feedback signal, FBCLK, the DOWN signal goes high, signaling that FBCLK must be retarded.

In this embodiment, digital filter 500 (similar to filter 100) preferably includes counter 51 and digital filter element 502. Digital filter element 502 preferably is similar to digital filter element 102, except that it does not include an ADC. However, it does preferably include a DSP 504 for processing counter output signals 54, 55, and a DAC 505 for converting digital DSP output 56 to an analog signal 57. Preferably, DSP 504 and DAC 505 include leads 507, 508, 510 and 511, allowing reuse of DSP 504 and DAC 505 either individually or as a unit, just as leads 107, 108, 110, 111 allow reuse of DSP 104 and DAC 105.

A programmable logic device (PLD) 20 incorporating a PLL 10 according to the present invention may be used in many kinds of electronic devices. One possible use is in a data processing system 900 shown in FIG. 7. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

Figure 7:
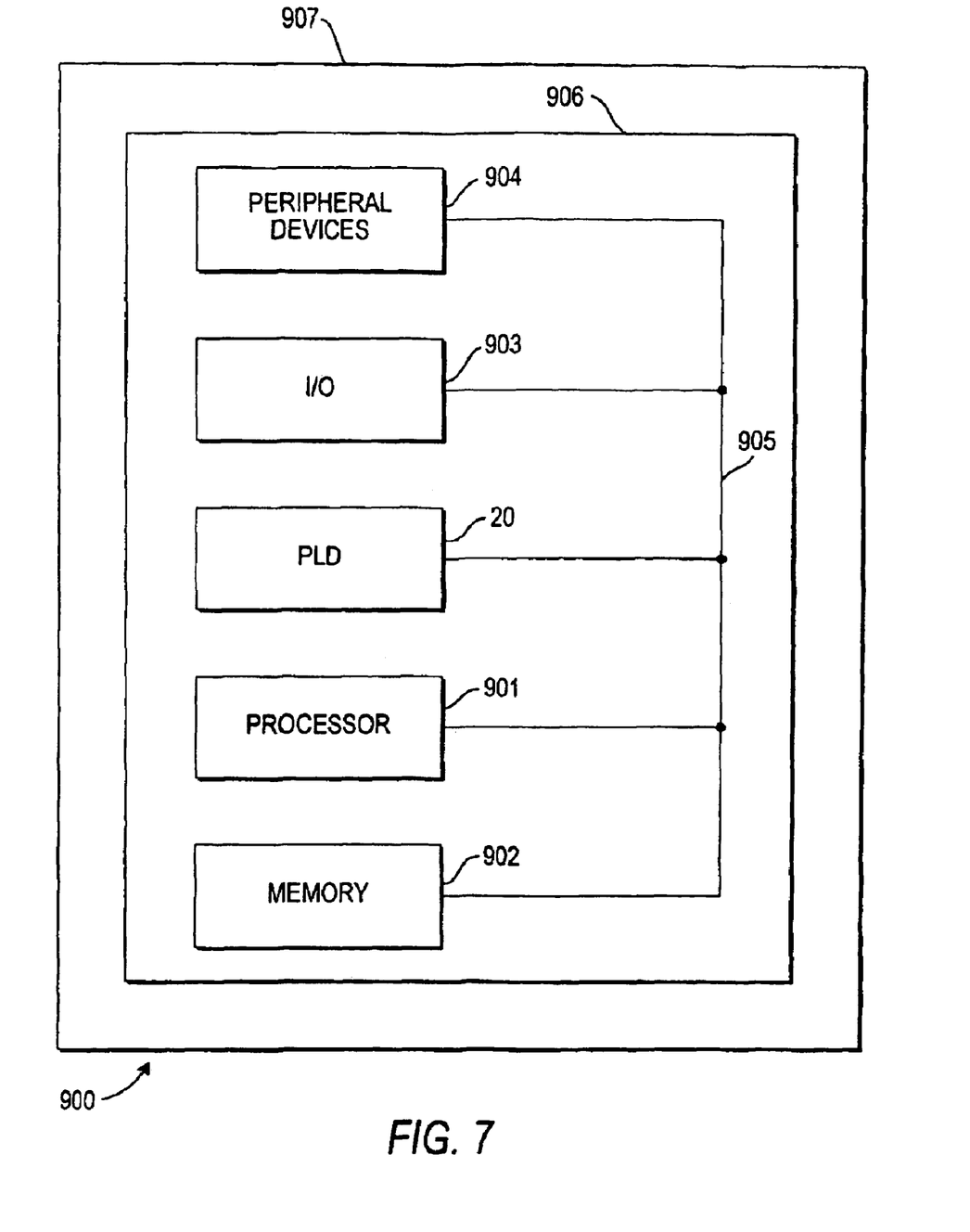
FIG. 7 is a simplified block diagram of an illustrative system employing a programmable logic device incorporating a phase-locked loop in accordance with the present invention.

System 900 can be used in a wide variety of applications, such as computer networking, data networking, instrumentation, video processing, digital signal processing, or any other application where the advantage of using programmable or reprogrammable logic is desirable. PLD 20 can be used to perform a variety of different logic functions. For example, PLD 20 can be configured as a processor or controller that works in cooperation with processor 901. PLD 20 may also be used as an arbiter for arbitrating access to a shared resources in system 900. In yet another example, PLD 20 can be configured as an interface between processor 901 and one of the other components in system 900. It should be noted that system 900 is only exemplary, and that the true scope and spirit of the invention should be indicated by the following claims.

Various technologies can be used to implement PLDs 20 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A dedicated circuit for use in a programmable logic device for performing a predetermined function, said dedicated circuit comprising:
   a plurality of components, each component in said plurality of components being connected to at least one other component in said plurality of components such that said plurality of components together perform said predetermined function, said dedicated circuit being connected to one or more predetermined portions of said programmable logic device; wherein:
   each of one or more of said plurality of components is programmably connectable, separately from said at least one other component in said plurality of components, to a portion of said programmable logic device other than said predetermined portions and other that said at least one other component in said plurality of components, for operation of said portion of said programmable logic device other than said predetermined portions with said one or more of said plurality of components.

2. The dedicated circuit of claim 1 wherein, when said dedicated circuit is not in use in said programmable logic device, said one or more of said plurality of components is available for use by said portion of said programmable logic device other than said predetermined portions.

3. The dedicated circuit of claim 1 wherein, when said dedicated circuit is in use in said programmable logic device, said portion of said programmable logic device other than said predetermined portions is available to be substituted in said dedicated circuit for said one or more of said plurality of components.

4. The dedicated circuit of claim 1 wherein:
   said dedicated circuit is a loop circuit comprising a signal generator for generating an output signal; and
   said at least one component comprises:
   a phase-frequency detector having as inputs a reference signal and said output signal, said phase-frequency detector outputting a comparison signal indicating a relationship between said reference signal and said output signal;
   an analog front end circuit having said comparison signal as an input and outputting an analog voltage signal indicative of said comparison;
   an analog-to-digital converter having said analog voltage signal as an input and outputting a digitized voltage signal;
   a digital signal processor having said digitized voltage signal as an input and outputting a digital control signal; and
   a digital-to-analog converter having said digital control signal as an input and outputting an analog control signal that is input to said signal generator.

5. The dedicated circuit of claim 4 wherein said analog-to-digital converter has at least one of:
   a second input from a first said another portion of said programmable logic device; and
   a second output to a second said another portion of said programmable logic device.

6. The dedicated circuit of claim 4 wherein said digital signal processor has at least one of:
   a second input programmably connectable to a first said another portion of said programmable logic device; and
   a second output programmably connectable to a second said another portion of said programmable logic device.

7. The dedicated circuit of claim 4 wherein said digital-to-analog converter has at least one of:
   a second input programmably connectable to a first said another portion of said programmable logic device; and
   a second output programmably connectable to a second said another portion of said programmable logic device.

8. The dedicated circuit of claim 4 wherein said analog front end circuit comprises a charge pump.

9. The dedicated circuit of claim 1 wherein:
said dedicated circuit is a loop circuit comprising a signal generator for generating an output signal; and
said at least one component comprises:
a phase-frequency detector having as inputs a reference signal and said output signal, said phase-frequency detector outputting digital comparison signals indicating a relationship between said reference signal and said output signal;
a digital counter circuit having said digital comparison signals as inputs and outputting digital count signals indicative of said comparison;
a digital signal processor having said digital count signals as inputs and outputting a digital control signal; and
a digital-to-analog converter having said digital control signal as an input and outputting an analog control signal that is input to said signal generator.

10. The dedicated circuit of claim 9 wherein said digital signal processor has at least one of:
an additional input programmably connectable to a first said another portion of said programmable logic device; and
a second output programmably connectable to a second said another portion of said programmable logic device.

11. The dedicated circuit of claim 9 wherein said digital-to-analog converter has at least one of:
a second input programmably connectable to a first said another portion of said programmable logic device; and
a second output programmably connectable to a second said another portion of said programmable logic device.

12. A digital processing system comprising:
processing circuitry;
a memory coupled to said processing circuitry; and
a programmable logic device, including the dedicated circuit defined in claim 1, coupled to the processing circuitry and the memory.

13. A printed circuit board on which is mounted a programmable logic device including the dedicated circuit defined in claim 1.

14. The printed circuit board defined in claim 13 further comprising:
memory circuitry mounted on the printed circuit board and coupled to the programmable logic device.

15. The printed circuit board defined in claim 14 further comprising:
processing circuitry mounted on the printed circuit board and coupled to the memory circuitry.

16. An integrated circuit device comprising the dedicated circuit of claim 1.

17. A digital processing system comprising:
processing circuitry;
a memory coupled to said processing circuitry; and
an integrated circuit device as defined in claim 16 coupled to the processing circuitry and the memory.

18. A printed circuit board on which is mounted an integrated circuit device as defined in claim 16.

19. The printed circuit board defined in claim 18 further comprising:
memory circuitry mounted on the printed circuit board and coupled to the integrated circuit device.

20. The printed circuit board defined in claim 19 further comprising:
processing circuitry mounted on the printed circuit board and coupled to the memory circuitry.

* * * * *